United States Patent [19]

Piguet

[11] 4,230,957
[45] Oct. 28, 1980

[54] LOGIC JK FLIP-FLOP STRUCTURE

[75] Inventor: Christian Piguet, Neuchatel, Switzerland

[73] Assignee: Centre Electronique Horloger S.A., Neuchatel, Switzerland

[21] Appl. No.: 922,844

[22] Filed: Jul. 7, 1978

[30] Foreign Application Priority Data

Jul. 8, 1977 [CH] Switzerland .................... 8474/77

[51] Int. Cl.³ .................... H03K 3/286; H03K 3/353; H03K 19/094; H03K 19/20
[52] U.S. Cl. .................... 307/279; 307/205; 307/288
[58] Field of Search .......... 307/203, 205, 207, 220 C, 307/225 C, 288, 279, 289, 291, 272 A

[56] References Cited

U.S. PATENT DOCUMENTS

| | | | |
|---|---|---|---|
| 3,267,295 | 8/1966 | Zuk | 307/279 X |
| 3,619,644 | 11/1971 | Vittoz | 307/291 X |
| 3,619,646 | 11/1971 | Vittoz | 307/225 C |
| 3,679,913 | 7/1972 | Foltz | 307/288 X |
| 3,753,009 | 8/1973 | Clapper | 307/279 |
| 3,835,337 | 9/1974 | Foltz | 307/288 X |
| 3,887,822 | 6/1975 | Suzuki | 307/288 X |
| 3,928,773 | 12/1975 | Oguey et al. | 307/225 C |
| 4,140,924 | 2/1979 | Oguey et al. | 307/279 X |

FOREIGN PATENT DOCUMENTS

| | | | |
|---|---|---|---|
| 929609 | 7/1973 | Canada | 307/279 |
| 2541255 | 3/1976 | Fed. Rep. of Germany | 307/205 |

OTHER PUBLICATIONS

Vittoz et al., "Complementary Dynamic M.O.S. Logic Circuits"; *Electronics Letters;* vol. 9, No. 4, pp. 77–78; 2/22/73.

*Primary Examiner*—Larry N. Anagnos
*Attorney, Agent, or Firm*—Cushman, Darby & Cushman

[57] ABSTRACT

A logic JK flip-flop structure is disclosed which may have a dynamic, semi-dynamic or static behavior as far as the clock signal is concerned. The structure of the invention is particularly simple in design and has a minimum number of transistors although it is insensitive to parasitic noise which might affect the control variables J,K, and it does not involve any logical hazards. The basic structure of the invention is schematically represented in FIG. 1.

13 Claims, 5 Drawing Figures

LOGIC JK FLIP-FLOP STRUCTURE

BACKGROUND OF THE INVENTION

The present invention relates to circuits with complementary MOS transistors and more particularly to bistable JK flip-flop structures. A typical structure of the type concerned comprises at least three logic gates each of which includes a first group of transistors of a first conduction type and a second group of transistors of a second conduction type, the two groups of transistors being connected in series across the terminals of a voltage supply source and their common connection point forming the output node of the gate. The conduction paths of the said transistors of each group are connected in series and/or in parallel to each other, so that the conduction state of these transistors determines the potential at the output node of the gate, which potential represents the inner variable provided by this gate and may take values substantially equal to those at the two terminals of the voltage supply source, the terminal connected to the first group of transistors being at a potential 1 and that connected to the second group of transistors being at the potential 0. Each transistor is controlled by an inner variable or by an external control variable such as J, K or H, H being a clock signal.

Various structures of bistable JK flip-flops are already known, in particular so-called "master-slave" circuits, circuits using transmission gates and circuits derived from bistable SR flip-flop circuits.

The circuit disclosed in the catalogue of Solid State Scientific Inc., CMOS Integrated Circuits, year 1976, p. 36, circuit SLC 4027A, for example, employs a D flip-flop linked to a combinatorial part. The behaviour of this circuit is insensitive to parasitic effects on the variables J and K and it is free of logical hazards. However, such a structure is quite complex as it includes thirty-six MOS transistors.

Another circuit known as MM 74 C 76 Dual JK flip-flop and appearing in the catalogue of National Semi-Conductor Corporation, year 1973, pages 8–11, is based on the same principle as the previously mentioned circuit and is also insensitive to parasitic noise affecting the variables J and K. However, this circuit requires the presence of the clock variable in the true form (H) and in the inverted form ($\overline{H}$), which is a drawback from the point of view of the required surface of the integrated circuit. Moreover, a logical hazard exists due to the delay of $\overline{H}$ with respect to H, since the variables H and $\overline{H}$ can momentarily take the same value and short-circuit two nodes having different logic states. It is thus necessary to control the delay of $\overline{H}$ with respect to H to ensure correct operation. Furthermore, production of these structures in integrated technology has certain drawbacks due to a bad separation of the p- and n-channel transistors of the transmission gates used in this circuit. Finally, the circuit comprises twenty-eight MOS transistors and is thus relatively complicated.

A JK flip-flop structure has also been produced which is derived from a SR flip-flop in which $S = J\overline{Q}$ and $R = KQ$. Such a circuit, however, also comprises twenty-eight MOS transistors when it is produced by CMOS technique and it is sensitive to parasitic noise affecting the control variables J and K. The flip-flop should operate only if $J = 1$ and if the edge of the clock signal allows operation. However, a parasitic noise on J could result in an output such that the flip-flop acts in response to the edge of the clock signal even if J is at its level $J = 0$.

OBJECT OF THE INVENTION

An object of the invention is to provide a logic bistable JK flip-flop structure which is particularly simple and comprises a minimum number of transistors, while ensuring an operation insensitive to parasitic noise which might affect the control variables J and K, and which also does not involve any logical hazards.

DEFINITION OF THE INVENTION

The structure according to the invention comprises the following logic gates, respectively designated by the inner variable they provide and including transistors indicated for each group and designated by their respective control variables, the connection of the conduction paths of these transistors being indicated in each group by "series" or "parallel", and an assembly indicated between brackets being considered as a whole:

Gate A:
first group: (B series J) parallel (C series H)
second group: (B parallel J) series H
Gate B:
first group: A series H
second group: A
Gate C:
first group: A series (B parallel K)
second group: (B series K series H) parallel A, the transistor controlled by A in the first group of gates B and C being preferably common to these gates and the output variable Q of the circuit being the variable B.

This basic structure according to the invention is a dynamic structure so far as the clock signal H is concerned and makes it possible to obtain semi-dynamic circuits, i.e. dynamic for one state of H and static for the other state, and static circuits, by using additional transistors. Similarly, it is possible to effect settings to "one" and "zero". The basic structure and the structures derived therefrom and called "ideal" structures since no variation of J or K occurs, while the clock H does not change. These structures comprise a minimum number of transistors, e.g. sixteen transistors in the case of the basic dynamic structure.

DESIGNATION OF THE DRAWINGS

The accompanying drawings illustrate by way of example and in the form of simplified circuit diagrams, various circuits including logic structures in accordance with the invention.

In the drawings:
FIG. 1 shows a JK flip-flop of dynamic behaviour as far as the clock signal H is concerned,
FIG. 2 shows a semi-dynamic JK flip-flop, which is dynamic for $H = 0$ and static for $H = 1$,
FIG. 3 shows another semi-dynamic JK flip-flop, i.e. dynamic for $H = 1$ and static for $H = 0$,
FIG. 4 shows a static JK flip-flop, and
FIG. 5 shows the general form of a circuit capable of being set to "one" and to "zero", the circuit being derived from one of the preceding circuits.

DESCRIPTION OF PREFERRED EMBODIMENTS

In the diagrams of FIGS. 1 to 5, the various MOS transistors forming the logic gates have been indicated by circles inside which the control variable applied to the gate of the corresponding transistor has been indicated, the shown connections being those of the conduction paths of the transistors. The output nodes of the logic gates are indicated by the respective inner variables A, B, C, E, F or G provided by these gates.

The transistors connected between the output nodes of the gates and the positive terminal (+) of a voltage supply source are p-channel transistors and the transistors connected between an output node and the negative terminal (−) of the voltage supply are n-channel transistors. Conventionally, the potentials at the terminals (+) and (−) are respectively indicated by 1 and 0, which values also represent the possible logic levels of the control variables of the circuit.

Figure 1:
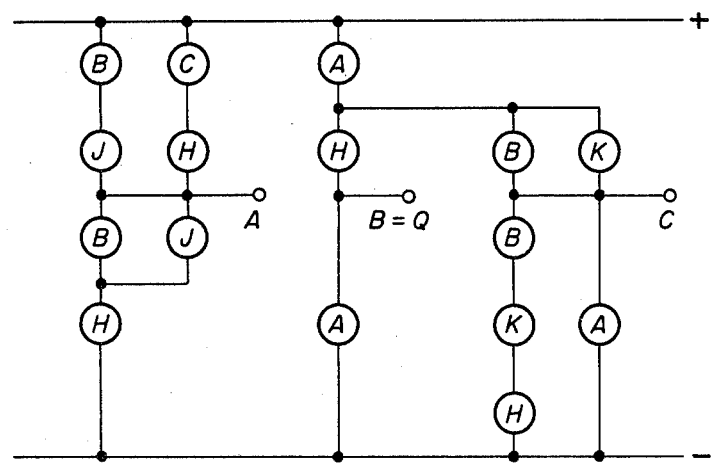

The dynamic circuit of FIG. 1 comprises three logic gates A, B and C including a total of sixteen MOS transistors. This circuit represents the basic structure according to the invention and the gates A, B and C are formed in the above indicated manner. The two states of the variable H, and only of this variable, must occur at a relatively high frequency in accordance with the well known principle of the so-called dynamic circuits. The output variable Q of this JK flip-flop is indicated by the variable B and it is only available in its true form.

The behaviour of the circuit of FIG. 1 may be illustrated by the following table (table I) in which the lines indicate the states of the circuit and columns indicate the various combinations of the control variables. The encircled states in this table represents the various stable states of the circuit. The conduction functions of each group of transistors can be indicated, in accordance with the article "Complementary Dynamic MOS Logic Circuits", E. VIttoz and H. Oguey, Electronic Letters, Feb. 22, 1973, Vol. 9, No. 4, by means of logic equations.

The logic equations of the circuit of FIG. 1 are as follows:

TABLE I

| A B C | \multicolumn{8}{c|}{H J K} |
|---|---|---|---|---|---|---|---|---|
|       | 000 | 001 | 011 | 010 | 100 | 101 | 111 | 1C0 |
| 1 0 0 | (100) | (100) | (100) | (100) | (100) | (100) | 000 | 000 |
| 0 0 0 |       |       |       |       |       |       | 001 | 001 |
| 0 0 1 | —     | —     | 011   | 011   | 101   | 101   | (001) | (001) |
| 1 0 1 |       |       |       |       | 100   | 100   |       |       |
| 0 1 1 | (011) | (011) | (011) | (011) | (011) | 010   | 010   | (011) |
| 0 1 0 | —     | 110   | 110   | —     | 011   | (010) | (010) | 011 |
| 1 1 0 |       | 100   | 100   |       |       |       |       |     |

Figure 2:
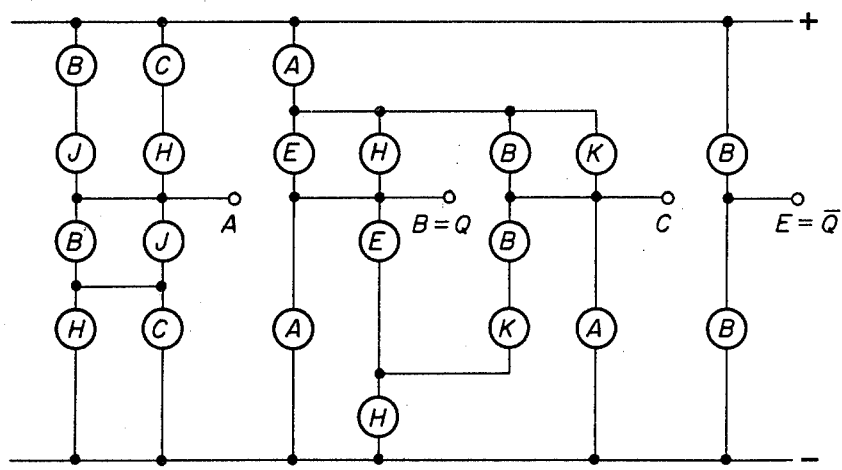

$A^+ = \overline{(B+J)(C+H)}$
$A^- = (B+J)H$
$B^+ = \overline{A+H}$
$B^- = A$
$C^+ = \overline{A+B\overline{K}}$
$C^- = A + BKH$ FIG. 2 shows a semi-dynamic circuit obtained from the basic dynamic structure by adding five MOS transistors so as to form four gates A, B, C and E as follows:
Gate A:
first group (p-channel): (B series J) parallel (C series H)
second group (n-channel): (B parallel J) series (H parallel C)
Gate B:
first group: A series (H parallel E)
second group: A parallel (E series H)
Gate C:
first group: A series (B parallel K)
second group: (B series K series H) parallel A
Gate E:
first group: B
second group: B As shown in the drawings, the transistor controlled by A in the first group of gates B and C and the transistor controlled by H in the second group of gates B and C may be in common to these gates, which results in a total of twenty-one transistors. The output variable Q is again the variable B and the output variable $\overline{Q}$, complementary to Q, is E.

The circuit of FIG. 2 is dynamic for H=0 and static for H=1. Its behaviour is illustrated by table II and the logic equations are as follows:

TABLE II

| A B C E | \multicolumn{8}{c|}{H J K} |
|---|---|---|---|---|---|---|---|---|
|         | 000 | 001 | 011 | 010 | 100 | 101 | 111 | 110 |
| 1 0 0 1 | (1001) | (1001) | (1001) | (1001) | (1001) | (1001) | 0001 | 0001 |
| 0 0 0 1 |        |        |        |        |        |        | 0011 | 0011 |
| 0 0 1 1 | —      | —      | 0111   | 0111   | 1011   | 1011   | (0011) | (0011) |
| 1 0 1 1 |        |        |        |        | 1001   | 1001   |        |        |
| 0 1 1 1 |        |        | 0110   | 0110   |        |        |        |        |
| 0 1 1 0 | (0110) | (0110) | (0110) | (0110) | (0110) | 0100   | 0100   | (0110) |
| 0 1 0 0 | —      | 1100   | 1100   | —      | 0110   | (0100) | (0100) | 0110 |
| 1 1 0 0 |        | 1000   | 1000   |        |        |        |        |     |
| 1 0 0 0 |        | 1001   | 1001   |        |        |        |        |     |

Figure 3:
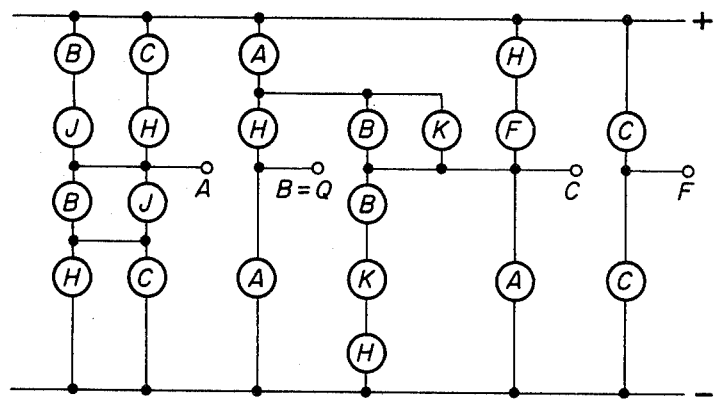

$A^+ = \overline{(B+J)(C+H)}$
$A^- = (B+J)(C+H)$
$B^+ = \overline{A+EH}$
$B^- = A+EH$
$C^+ = \overline{A+B\overline{K}}$
$C^- = A+BKH$
$E^+ = \overline{B}$
$E^- = B$ A similar semi-dynamic structure is shown in FIG. 3. This structure is dynamic for H=1 and static for H=0 and it also comprises twenty-one MOS transistors. The output variable is again the variable B (the complementary output variable $\overline{Q}$ is not available in this circuit).

The circuit of FIG. 3 comprises the four logic gates A, B, C and F formed as follows:
Gate A:
first group: (B series J) parallel (C series H)
second group: (B parallel J) series (H parallel C)
Gate B:
first group: A series H
second group: A
Gate C:
first group:
A series (B parallel K) parallel (H series F)
second group: (B series K series H) parallel A
Gate F:
first group: C
second group: C As shown in the drawings, the transistor controlled by A in the first group of gates B and C may be in common to these gates.

Figure 4:
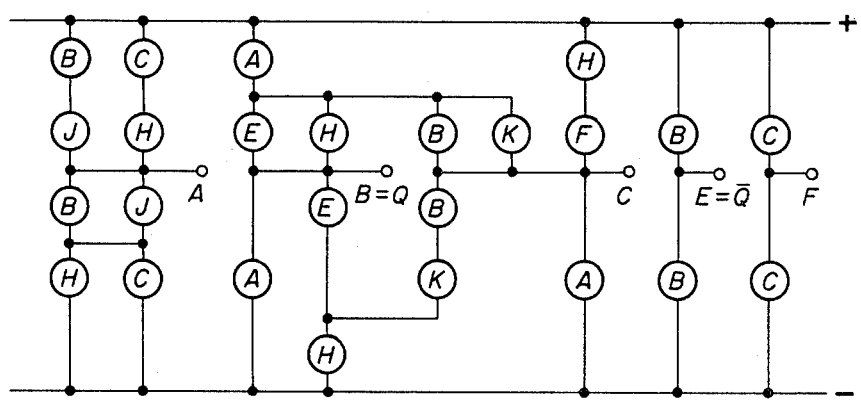

The logic equations of this circuit are as follows:
$A^+ = \overline{(B+J)(C+H)}$
$A^- = (B+J)(C+H)$
$B^+ = \overline{A+H}$
$B^- = A$
$C^+ = \overline{(A+B\overline{K})(F+H)}$
$C^- = A+BKH$
$F^+ = \overline{C}$
$F^- = C$ FIG. 4 illustrates the diagram of a static bistable JK flip-flop also derived from the basic structure and more particularly from the semi-dynamic structure of FIG. 2. It comprises five gates A, B, C, E and F, the gates A, B and E being formed in an identical manner as the gates of FIG. 2, and the gates C and F being identical to the gates designated by the same letter in FIG. 3. The structure thus obtained comprises a total of twenty-five MOS transistors and it is again an ideal structure. The behaviour of the circuit of FIG. 4 is illustrated by the following table III.

The output variables are Q=B and $\overline{Q}$=E and the logic equations of the circuit are as follows:

$A = \overline{(B+J)(C+H)}$
$B = \overline{A+EH}$
$C = \overline{(A+BK)(F+H)}$
$E = \overline{B}$
$F = \overline{C}$

TABLE III

| A B C E F | H J K |  |  |  |  |  |  |  |
|---|---|---|---|---|---|---|---|---|
|  | 000 | 001 | 011 | 010 | 100 | 101 | 111 | 110 |
| 1 0 0 1 1 | ⓘ0011 | ⓘ0011 | ⓘ0011 | ⓘ0011 | ⓘ0011 | ⓘ0011 | 00011 | 00011 |
| 0 0 0 1 1 |  |  |  |  |  |  | 00111 | 00111 |
| 0 0 1 1 1 |  |  |  |  |  |  | 00110 | 00110 |
| 0 0 1 1 0 | — | — | 01110 | 01110 | 10110 | 10110 | ⓘ0110 | ⓘ0110 |
| 1 0 1 1 0 |  |  |  |  | 10010 | 10010 |  |  |
| 1 0 0 1 0 |  |  |  |  | 10011 | 10011 |  |  |
| 0 1 1 1 0 |  |  | 01100 | 01100 |  |  |  |  |
| 0 1 1 0 0 | ⓘ1100 | ⓘ1100 | ⓘ1100 | ⓘ1100 | ⓘ1100 | 01000 | 01000 | ⓘ1100 |
| 0 1 0 0 0 |  |  |  |  |  | 01001 | 01001 |  |
| 0 1 0 0 1 | — | 11001 | 11001 | — | 01101 | ⓘ1001 | ⓘ1001 | 01101 |
| 0 1 1 0 1 |  |  |  |  | 01100 |  |  | 01100 |
| 1 1 0 0 1 |  | 10001 | 10001 |  |  |  |  |  |
| 1 0 0 0 1 |  | 10011 | 10011 |  |  |  |  |  |

The circuits illustrated in FIGS. 1 to 4 may be completed by the introduction of two additional control variables to obtain circuits capable of being set to "one" and to "zero". According to the conventional terminology, these two additional variables are indicated by S (Set) for setting to "one" and R (Reset) for setting to "zero".

Figure 5:
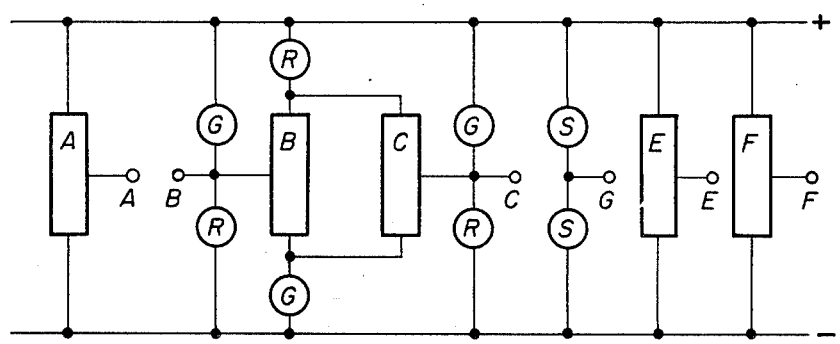

FIG. 5 shows the general diagram of such a circuit in which the gates A, B, C and F have the configurations previously described with reference to the respective dynamic, semi-dynanmic of static circuits. An additional logic gate G is provided, this gate comprising a p-channel transistor and an n-channel transistor, these two transistors being controlled by the variable S. Furthermore, the gates B and C comprise two common additional transistors respectively connected in series with the first and second groups of these gates and respectively controlled by the variable R and the inner variable G. Finally, a transistor controlled by G is connected in parallel with the transistor assembly of the first group and a transistor controlled by R is connected in parallel with the transistor assembly of the second group in each of the gates B and C completed by the said series-connected additional transistors.

The logic equations of a static bistable JK flip-flop structure with the possibility of being to "one" and to "zero" in accordance with FIG. 5, are as follows:

$A = \overline{(B+J)(C+H)}$
$B = \overline{R+G(A+EH)}$
$C = \overline{G(R+(A+BK)(F+K)}$
$E = \overline{B}$
$F = \overline{C}$
$G = \overline{S}$ The latter circuit thus comprises thirty-three MOS transistors, whereas the equivalent flip-flop used up to now require at least forty-four transistors (catalogue of Solid State Scientific Inc., circuit SLC 4027A).

It can be noted that from a JK flip-flop structure in accordance with the invention, a corresponding T flip-flop structure can be obtained by linking the connections of the control variables J and K so that J=K=T. The logic equations of a static T flip-flop thus become:

$A = \overline{(B+T)(C+H)}$
$B = \overline{A+EH}$
$C = \overline{(A+BT)(F+H)}$
$E = \overline{B}$
$F = \overline{C}$ The behaviour of the circuits in accordance with the invention is ideal in the sense that they do not react to parasitic noise appearing at J and K while the clock signal H does not change.

On the other hand, it appears from the state tables of the above described circuits that each state differs from the following one only by one variable. In other words, between two successive states, only one variable changes so as to avoid any race between two variables which would result in a logical hazard. Thus, the circuits in accordance with the invention do not involve any logical hazards.

What is claimed is:

1. A logic bistable JK flip-flop structure capable of being realized in integrated circuit technology with complementary MOS transistors, comprising at least three logic gates each of which comprises a first group of transistors of a first conduction type and a second group of transistors of a second conduction type, these two groups of transistors being connected in series across the terminals of a voltage supply source and their common connection point forming the output node of the gate, the conduction paths of the transistors of each group being connected in series and/or in parallel with each other, so that the conduction state of these transistors define the potential at the output node of the gate, which represents the inner variable provided by this gate and may take values substantially equal to those at the two terminals of the voltage supply source, each transistor being controlled by an inner variable or by an external control variable such as J, K or H, H being a clock signal, the said structure comprising the following logic gates, respectively indicated by the inner variable they provide, said gates being formed by transistors indicated for each group and designated by their respective control variables, the connection of the conduction paths of these transistors being indicated in each group by "series" or "parallel", an assembly indicated between brackets being considered as a whole:

Gate A:
  first group: (B series J) parallel (C series H)
  second group: (B parallel J) series H
Gate B:

first group: A series H
second group: A

Gate C:
first group: A series (B parallel K)
second group: (B series K series H) parallel A, the transistor controlled by A in the first groups of the gates B and C being preferably common to these gates and the output variable Q of the circuit being the variable B.

2. A logic structure as claimed in claim 1, forming a semi-dynamic circuit, i.e. dynamic for H=0 and static for H=1, 1 and 0 substantially corresponding to the potentials at the terminals of the voltage supply source, the said terminals being respectively connected to the first and the second groups of transistors, said structure comprising the following logic gates:

Gate A:
first group: (B series J) parallel (C series H)
second group: (B parallel J) series (H parallel C)

Gate B:
first group: A series (H parallel E)
second group: A parallel (E series H)

Gate C:
first group: A series (B parallel K)
second group: (B series K series H) parallel A Gate E:
first group: B
second group: B, the transistor controlled by A in the first groups of the gates B and C and the transistor controlled by H in the second groups of the gates B and C being preferably each common to these gates and the output variable Q of the circuit, complementary to Q, being the variable E.

3. A logic structure as claimed in claim 1 forming a semi-dynamic circuit, i.e. dynamic for H=1 and static for H=0, 1 and 0 substantially corresponding to the potentials at the terminals of the voltage supply source, the said terminals being respectively connected to the first and second groups of transistors, said structure comprising the following logic gates:

Gate A:
first group: (B series J) parallel (C series H)
second group: (B parallel J) series (H parallel C)

Gate B:
first group: A series H
second group: A

Gate C:
first group:
(A series (B parallel K)) parallel (H series F)
second group: (B series K series H) parallel A Gate F:
first group: C
second group: C, the transistor controlled by A in the first groups of gates B and C being preferably common to these gates and the output variable Q of the circuit being the variable B.

4. A logic structure as claimed in claim 1, forming a static structure i.e. static for H=1, 1 and 0 substantially corresponding to the potentials at the terminals of the voltage supply source, the said terminals being respectively connected to the first and the second groups of transistors, and comprising and E as claimed in claim 2, and gates C and F as claimed in the following logic gates:

Gate A:
first group: (B series J) parallel (C series H)
second group: (B parallel J) series (H parallel C)

Gate B:
first group: A series (H parallel E)
second group: A parallel (E series H)

Gate C:
first group: (A series (B parallel K)) parallel (H series F)
second group: (B series K series H) parallel A Gate E:
first group: B
second group: B Gate F:
first group: C
second group: C, the transistor controlled by A in the first groups of the gates B and C and the transistor controlled by H in the second groups of the gates B and C being preferably each common to these gates and the output variable Q of the circuit being B and the output variable $\bar{Q}$ being E.

5. A logic structure as claimed in any one of the claims 1 to 4, wherein the connections of the control variables J and K are linked so that J=K=T, the circuit forming a T flip-flop.

6. A logic structure as claimed in any one of the claims 1 to 4, wherein at least two transistors of the same conduction type, which are connected in series, are subjected to permutation.

7. A logic structure as claimed in any one of the claims 1 to 4, wherein the said first type of conduction is the type p and said second type of conduction is the type n.

8. A logic structure as claimed in any one of the claims 1 to 4, wherein the said first type of conduction is the type n and the second type of conduction is the type p.

9. A logic structure as claimed in any one of the claims 1 to 4, forming a circuit capable of being set to "one" and to "zero" by means of external control variables S and R, the values S=1 and R=1 respectively producing the states Q=1 and Q=0, 1 and 0 respectively corresponding to the potentials at the terminals of the voltage supply source, the said terminals being respectively connected to the first and second groups of transistors, said structure comprising a logic gate G including a transistor of the first conduction type and a transistor of the second conduction type each of which is controlled by S, the gates B and C comprising a first common additional transistor controlled by R, connected in series with the transistors of the first group, and a second common additional transistor controlled by G, connected in series with the transistors of the second group, a further transistor controlled by G being connected in parallel with the transistor assembly of the first group and a further transistor controlled by R being connected in parallel with the transistor assembly of the second group in each of the gates B and C completed by the said additional series-connected transistors.

10. A logic structure as claimed in claim 9, wherein the connections of the control variables J and K are linked so that J=K=T, the circuit forming a T flip-flop.

11. A logic structure as claimed in claim 9, wherein at least two transistors of the same conduction type, which are connected in series, are subjected to permutation.

12. A logic structure as claimed in claim 9 wherein the said first type of conduction is the type p and said second type of conduction is the type n.

13. A logic structure as claimed in claim 9 wherein the said first type of conduction is the type n and the second type of conduction is the type p.

* * * * *